United States Patent
Pambucol

(10) Patent No.: US 11,567,530 B2
(45) Date of Patent: Jan. 31, 2023

(54) ENHANCED TIME RESOLUTION FOR REAL-TIME CLOCKS

(71) Applicant: Honeywell International Inc., Morris Plains, NJ (US)

(72) Inventor: Vlad Pambucol, Raleigh, NC (US)

(73) Assignee: Honeywell International Inc., Charlotte, NC (US)

( * ) Notice: Subject to any disclaimer, the term of this patent is extended or adjusted under 35 U.S.C. 154(b) by 170 days.

(21) Appl. No.: 17/185,402

(22) Filed: Feb. 25, 2021

(65) Prior Publication Data

US 2021/0397212 A1     Dec. 23, 2021

Related U.S. Application Data

(60) Provisional application No. 62/705,249, filed on Jun. 18, 2020.

(51) Int. Cl.
| | |
|---|---|
| G06F 1/14 | (2006.01) |
| H04L 7/00 | (2006.01) |
| G01R 35/04 | (2006.01) |
| G01D 21/02 | (2006.01) |

(52) U.S. Cl.
CPC .............. *G06F 1/14* (2013.01); *G01D 21/02* (2013.01); *G01R 35/04* (2013.01); *H04L 7/0008* (2013.01)

(58) Field of Classification Search
CPC ........................................................ G06F 1/14
See application file for complete search history.

(56) References Cited

U.S. PATENT DOCUMENTS

| | | | |
|---|---|---|---|
| 4,804,957 A | 2/1989 | Selph et al. | |
| 5,153,837 A * | 10/1992 | Shaffer | G06Q 50/06 |
| | | | 705/412 |
| 2006/0040402 A1* | 2/2006 | Brauker | A61B 5/1495 |
| | | | 701/22 |

(Continued)

FOREIGN PATENT DOCUMENTS

CN       105974192 A       9/2016

OTHER PUBLICATIONS

Chen Y-Y, Lin Y-H. A Smart Autonomous Time- and Frequency-Domain Analysis Current Sensor-Based Power Meter Prototype Developed over Fog-Cloud Analytics for Demand-Side Management. Sensors. 2019; 19(20):4443 (29 pages total).

*Primary Examiner* — Phil K Nguyen
(74) *Attorney, Agent, or Firm* — John Maldjian; Stevens & Lee PC

(57) ABSTRACT

Enhanced resolution for a real-time clock is implemented, which includes a real-time clock configured to operate at a first time resolution, at least one processing unit configured to operate at a second time resolution, wherein the second time resolution has a higher frequency than the first time resolution, a memory for storing data at a location including data from the real-time clock and the at least one processing unit, an interrupt configured to load information into the memory at the location using the at least one processing unit, the interrupt further configured to operate at a frequency associated with the second time resolution, a timing service configured to read information from the memory at the location, the timing service configured to operate at the second time resolution, and a calibration module configured to re-calibrate the real-time clock.

20 Claims, 6 Drawing Sheets

(56) References Cited

U.S. PATENT DOCUMENTS

| | | | | |
|---|---|---|---|---|
| 2010/0054387 A1* | 3/2010 | Wu | ................... | G06F 13/4291 |
| | | | | 375/376 |
| 2015/0276433 A1* | 10/2015 | Brahmajosyula | ...... | G06Q 10/10 |
| | | | | 340/870.02 |
| 2020/0005830 A1* | 1/2020 | Wasada | .................. | G11B 27/11 |
| 2020/0159446 A1* | 5/2020 | Alsasua | ................ | G06F 3/0604 |
| 2021/0070336 A1* | 3/2021 | Howard | .................. | B61L 27/57 |

* cited by examiner

ENHANCED TIME RESOLUTION FOR REAL-TIME CLOCKS

CROSS-REFERENCE TO RELATED APPLICATION

This application claims the benefit of U.S. Provisional Application Ser. No. 62/705,249 filed Jun. 18, 2020, entitled "ENHANCED TIME RESOLUTION FOR REAL-TIME CLOCKS", which is incorporated herein by reference in its entirety.

BACKGROUND

It is common for an electronic device to be installed at a remote location with a network connection to a second device. The second device can gain access to, interact with, and/or control the electronic device. Typically, these electronic devices have a central processing unit (CPU or processor) for performing the processing needed to provide the desired functionality. Fundamental to CPUs is the utilization of a real-time clock for coordinating and scheduling the activities the CPU needs to perform to provide the required results. An electronic power meter is one example of an electronic device that is equipped with a CPU that keeps time based on a real-time clock circuit or chip.

It is also very common that an electronic device is installed at a remote location and expected to perform its functions for many years, if not decades. Technology rapidly improves, especially in the cloud and via connected and mobile devices. Yet many of the electronic devices in remote locations have limited functionality and/or perform very basic functions. This type of electronic device can perform its needed function for a long time despite having outdated hardware. The cost to replace these devices in favor of new hardware often outweighs the savings achieved by maximizing and enhancing the functionality of the existing electronic devices via downloading new firmware or software, for example. This is especially true when the hardware is rugged and still has a long existing useful life.

In electronic power meters, for example, it is common for an operator, utility, or other system to need a higher time resolution than the real-time clock chip can provide in an existing meter. It would be beneficial if the system were able to interact with the real-time clock as if the real-time clock had a higher resolution than it natively provides, rather than completely removing and replacing the meter.

SUMMARY

Enhanced resolution for a real-time clock is implemented, which can enhance the functionality of an electronic device. One implementation is a device that includes a real-time clock configured to operate at a first time resolution, at least one processing unit configured to operate at a second time resolution, wherein the second time resolution has a higher frequency than the first time resolution, a memory for storing data at a location including data from the real-time clock and the at least one processing unit, an interrupt configured to load information into the memory at the location using the at least one processing unit, the interrupt further configured to operate at a frequency associated with the second time resolution, a timing service configured to read information from the memory at the location, the timing service configured to operate at the second time resolution, and a calibration module configured to re-calibrate the real-time clock at an interval associated with the first time resolution using an offset associated with the second time resolution, and a processing sub-unit wherein the processing sub-unit is configured to receive an input signal requiring a frequency that is higher than the frequency of the real-time clock.

Another implementation is a system that includes a clock system comprising a real-time clock that operates at a one second frequency, a processing system that operates at a one millisecond frequency, a memory system for storing data associated with the clock system and the processing system, the memory system operating at a frequency of at least one millisecond, an operating system for loading the data in the memory system at a frequency of at least one millisecond, a calibration system for coordinating the clock system and the processing system at a frequency of one second by applying a millisecond offset to the real-time clock every second, a control system for sending an input signal to the operating system, the input signal requiring a frequency of one millisecond; and a processing sub-system to receive the input signal and process the input signal at a rate associated with one millisecond.

In another example, a method is implemented, which includes receiving a first signal at a first interval from the real-time clock of the electronic device, receiving a second signal at a second interval from a processing unit, of the electronic device, wherein the second interval of the second signal has a higher frequency resolution than the first interval of the first signal and wherein the real-time clock has a lower frequency than the processing unit, sending a calibration signal periodically at a rate that corresponds to the second interval, wherein the calibration signal is used to coordinate the first and second intervals, and receiving an input at the electronic device, wherein the input requires a higher frequency than the frequency of the real-time clock.

DETAILED DESCRIPTION OF THE INVENTION

Figure 1:
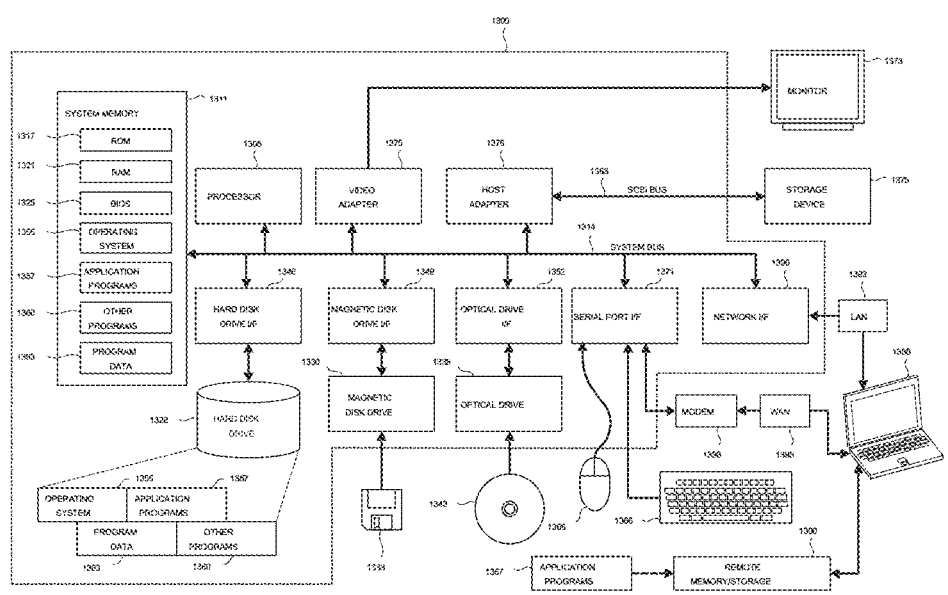
FIG. 1 is a simplified block diagram of an illustrative architecture of a computer system that enhances time resolution for a real-time clock.

FIG. 1 is a simplified block diagram of an illustrative architecture of a computer system 100 that enhances time resolution for a real-time clock. In one example, the computer system 100 includes a processor 105, a system memory 111, and a system bus 114 that couples various system components including the system memory 111 to the processor 105. The system bus 114 may be any of several types of bus structures, including a memory bus or memory controller, a peripheral bus, or a local bus using any of a variety of bus architectures. The system memory 111 includes read only memory (ROM) 117 and random-access memory (RAM) 121. A basic input/output system (BIOS) 125, containing the basic routines that help to transfer information between elements within the computer system 100, such as during startup, is stored in ROM 117. The computer system 100 may further include a hard disk drive 128 for reading from and writing to an internally disposed hard disk (not shown), a magnetic disk drive 130 for reading from or writing to a removable magnetic disk 133 (e.g., a floppy disk), and an optical disk drive 138 for reading from or writing to a removable optical disk 143 such as a CD (compact disc), DVD (digital versatile disc), or other optical media. The hard disk drive 128, magnetic disk drive 130, and optical disk drive 138 are connected to the system bus 114 by a hard disk drive interface 146, a magnetic disk drive interface 149, and an optical drive interface 152, respectively. The drives and their associated computer-readable storage media provide non-volatile storage of computer-readable instructions, data structures, program modules, and other data for the computer system 100.

Although this illustrative example includes a hard disk, a removable magnetic disk 133, and a removable optical disk 143, other types of computer-readable storage media which can store data that is accessible by a computer such as magnetic cassettes, Flash memory cards, digital video disks, data cartridges, random access memories (RAMs), read only memories (ROMs), and the like may also be used in some applications of the present use of enhancing the time resolution of a real-time clock. In addition, as used herein, the term computer-readable storage media includes one or more instances of a media type (e.g., one or more magnetic disks, one or more CDs, etc.). For purposes of this specification and the claims, the phrase "computer-readable storage media" and variations thereof, are intended to cover non-transitory embodiments, and do not include waves, signals, and/or other transitory and/or intangible communication media.

A number of program modules may be stored on the hard disk, magnetic disk 133, optical disk 143, ROM 117, or RAM 121, including an operating system 155, one or more application programs 157, other program modules 160, and program data 163. A user may enter commands and information into the computer system 100 through input devices such as a keyboard 166 and pointing device 168 such as a mouse. Other input devices (not shown) may include a microphone, joystick, game pad, satellite dish, scanner, trackball, touchpad, touchscreen, touch-sensitive device, voice-command module or device, user motion or user gesture capture device, or the like. These and other input devices are often connected to the processor 105 through a serial port interface 171 that is coupled to the system bus 114, but may be connected by other interfaces, such as a parallel port, game port, or universal serial bus (USB). A monitor 173 or other type of display device is also connected to the system bus 114 via an interface, such as a video adapter 175. In addition to the monitor 173, personal computers typically include other peripheral output devices (not shown), such as speakers and printers. The illustrative example shown in FIG. 1 also includes a host adapter 178, a Small Computer System Interface (SCSI) bus 183, and an external storage device 176 connected to the SCSI bus 183.

The computer system 100 is operable in a networked environment using logical connections to one or more remote computers, such as a remote computer 188. The remote computer 188 may be selected as another personal computer, a server, a router, a network PC, a peer device, or other common network node, and typically includes many or all of the elements described above relative to the computer system 100, although only a single representative remote memory/storage device 190 is shown in FIG. 1. The logical connections depicted in FIG. 1 include a local area network (LAN) 193 and a wide area network (WAN) 195. Such networking environments are often deployed, for example, in offices, enterprise-wide computer networks, intranets, and the Internet.

When used in a LAN networking environment, the computer system 100 is connected to the local area network 193 through a network interface or adapter 196. When used in a WAN networking environment, the computer system 100 typically includes a broadband modem 198, network gateway, or other means for establishing communications over the wide area network 195, such as the Internet. The broadband modem 198, which may be internal or external, is connected to the system bus 114 via a serial port interface 171. In a networked environment, program modules related to the computer system 100, or portions thereof, may be stored in the remote memory storage device 190. It is noted that the network connections shown in FIG. 1 are illustrative and other means of establishing a communications link between the computers may be used depending on the specific requirements of an application of the present use of enhancing the time resolution of a real-time clock.

Figure 2:
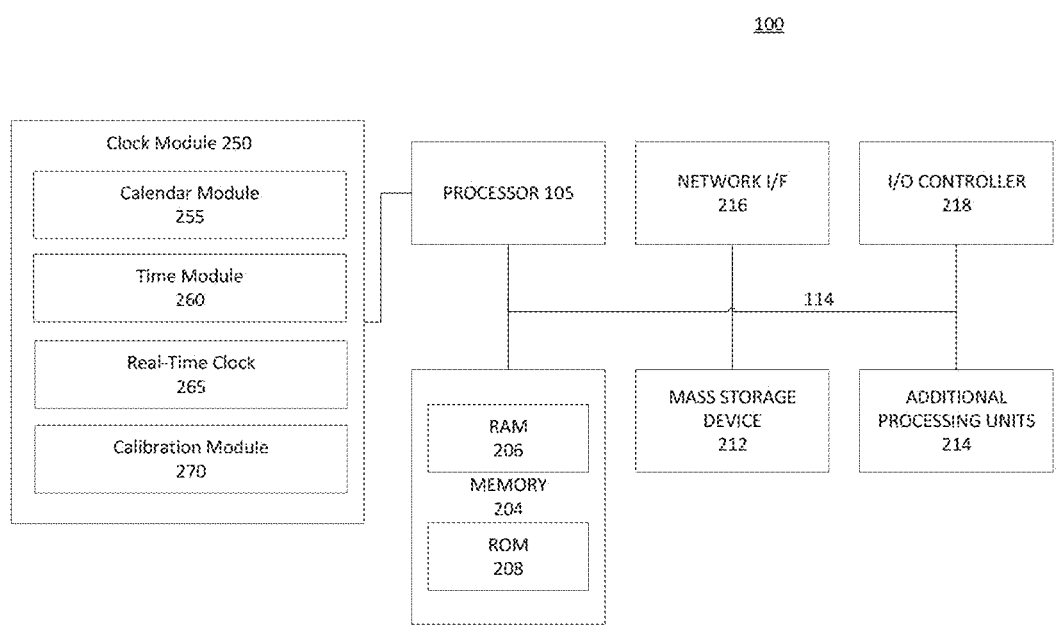
FIG. 2 shows an illustrative architecture for a computing device for enhancing resolution for the real-time clock.

FIG. 2 shows an illustrative architecture for a computing device for the present use of enhancing time resolution for real-time clocks. In one example, the architecture can be for an electronic device 100, such as an electronic power meter and the like. The device 100 illustrated in FIG. 2 includes one or more processors 105 (e.g., central processing unit, dedicated Artificial Intelligence chip, graphics processing unit, etc.), a system memory 204, including RAM (random access memory) 206 and ROM (read only memory) 208, and a system bus 114 that operatively and functionally couples the components in the device 100. A basic input/output system containing the basic routines that help to transfer information between elements within the device 100, such as during startup, is typically stored in the ROM 208. The device 100 further includes a mass storage device 212 for storing software code or other computer-executed code that is utilized to implement applications, the file system, and the operating system. The mass storage device 212 is connected to the processor 105 through a mass storage controller (not shown) connected to the bus 114. The mass storage device 212 and its associated computer-readable storage media provide non-volatile storage for the device 100. Although the description of computer-readable storage media contained herein refers to a mass storage device, such as a hard disk or CD-ROM drive, it may be appreciated by those skilled in the art that computer-readable storage media can be any available storage media that can be accessed by the device 100.

By way of example, and not limitation, computer-readable storage media may include volatile and non-volatile, removable and non-removable media implemented in any method or technology for storage of information such as computer-readable instructions, data structures, program modules, or other data. For example, computer-readable media includes, but is not limited to, RAM, ROM, EPROM (erasable programmable read only memory), EEPROM (electrically erasable programmable read only memory), Flash memory or other solid state memory technology, CD-ROM, DVD, HD-DVD (High Definition DVD), Blu-ray or other optical storage, magnetic cassette, magnetic tape, magnetic disk storage or other magnetic storage device, or any other medium which can be used to store the desired information and which can be accessed by the device 100.

According to various embodiments, the device 100 may operate in a networked environment using logical connections to remote computers through a network. The device 100 may connect to the network through a network interface unit 216 connected to the bus 114. It may be appreciated that the network interface unit 216 also may be utilized to connect to other types of networks and remote computer systems. The device 100 also may include an input/output controller 218 for receiving and processing input from a number of other devices, including a keyboard, mouse, touchpad, touchscreen, control devices such as buttons and switches or electronic stylus (not shown in FIG. 2). Similarly, the input/output controller 218 may provide output to a display screen, user interface, a printer, or other type of output device (also not shown in FIG. 2).

It may be appreciated that the software components described herein may, when loaded into the processor 105 and executed, transform the processor 105 and the overall device 100 from a general-purpose computing system into a special-purpose computing system customized to facilitate the functionality presented herein. The processor 105 may be constructed from any number of transistors or other discrete circuit elements, which may individually or collectively assume any number of states. More specifically, the processor 105 may operate as a finite-state machine, in response to executable instructions contained within the software modules disclosed herein. These computer-executable instructions may transform the processor 105 by specifying how the processor 105 transitions between states, thereby transforming the transistors or other discrete hardware elements constituting the processor 105.

Processor 105 also includes a clock module 250. The clock module 250 is responsible for the coordination of the instructions that are executed in processor 105. To this end, the clock module 250 keeps and maintains time at a required level of precision using a real-time clock 265. This includes utilizing a time module 260 and a calendar module 255. Calendar module 255 is responsible for keeping the current date and accounting for variations in the lengths of different months. For example, June has only 30 days. So, calendar module 255 would automatically provide a day increment from June 30, which would cause the clock module 250 to provide the date of July 1 to the device 100. The time module 260 is responsible for reporting the current time to the clock module 250. The clock module 250 and its respective components may be implemented in hardware, software, and firmware. Alternatively, aspects of the clock module 250 may be implemented partially in some or all of the blocks.

In one implementation, the calendar module 255 and time module 260 are implemented in software. In this case, a crystal driving a clock signal from the processor 105 is divided into counters in the processor 105, which output interrupts every second. Firmware in the electronic device 100 receives and processes the interrupts. For example, the firmware may count until it receives 60, one second interrupts to record one minute. Likewise, the clock module 250 continues counting until it records 60 minutes and saves it as one hour.

Software algorithms in the clock module 250 are also used to account for the months that have less than 31 days, as previously described. The data associated with the date and time is reported by the clock module 255 to the memory 204 in a shared memory space (not shown). In the shared memory space, other sub-systems of the device 100 are capable of receiving information associated with the current time and date. One example of such an electronic device 100, is an electronic power meter designed by Honeywell ("A3 power meter").

In another implementation, the processor 150 has a dedicated circuit with the real-time clock 265. This real-time clock circuit 265 has a dedicated power source (not shown) and it is capable of providing the time and date to calendar module 255 and time module 260 without any software layers. For any of the firmware subsystems in the electronic device 100 to know what time is it, they read the real-time clock 265 through a shared memory location in the memory 204. The real-time clock 265 also has a precise signal that the processor 105 gets interrupted each second. This signal can be used in a variety of cyclic processes in the electronic device 100. In this example, the electronic device 100, is an electronic power meter designed by Honeywell ("A4 power meter"). One cyclic process that would need to access memory 204 for the data sent from the real-time clock 265 would be a temperature check every 5 seconds, for example.

Encoding the software modules presented herein also may transform the physical structure of the computer-readable storage media presented herein. The specific transformation of physical structure may depend on various factors in different implementations of this description. Examples of such factors may include, but are not limited to, the technology used to implement the computer-readable storage media, whether the computer-readable storage media is characterized as primary or secondary storage, and the like. For example, if the computer-readable storage media is implemented as semiconductor-based memory, the software disclosed herein may be encoded on the computer-readable storage media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable storage media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media to change the optical characteristics of those locations. Other transformations of physical media are possible without departing from the scope and spirit of the present description, with the foregoing examples provided only to facilitate this discussion.

In light of the above, it may be appreciated that many types of physical transformations take place in the electronic device 100 in order to store and execute the software components presented herein. It also may be appreciated that the electronic device 100 may include other types of computing devices, including wearable devices, handheld computers, embedded computer systems, smartphones, PDAs, and other types of computing devices known to those skilled in the art. It is also contemplated that the electronic device 100 may not include all of the components shown in FIG. 2, may include other components that are not explicitly shown in FIG. 2, or may utilize an architecture completely different from that shown in FIG. 2.

Figure 3:
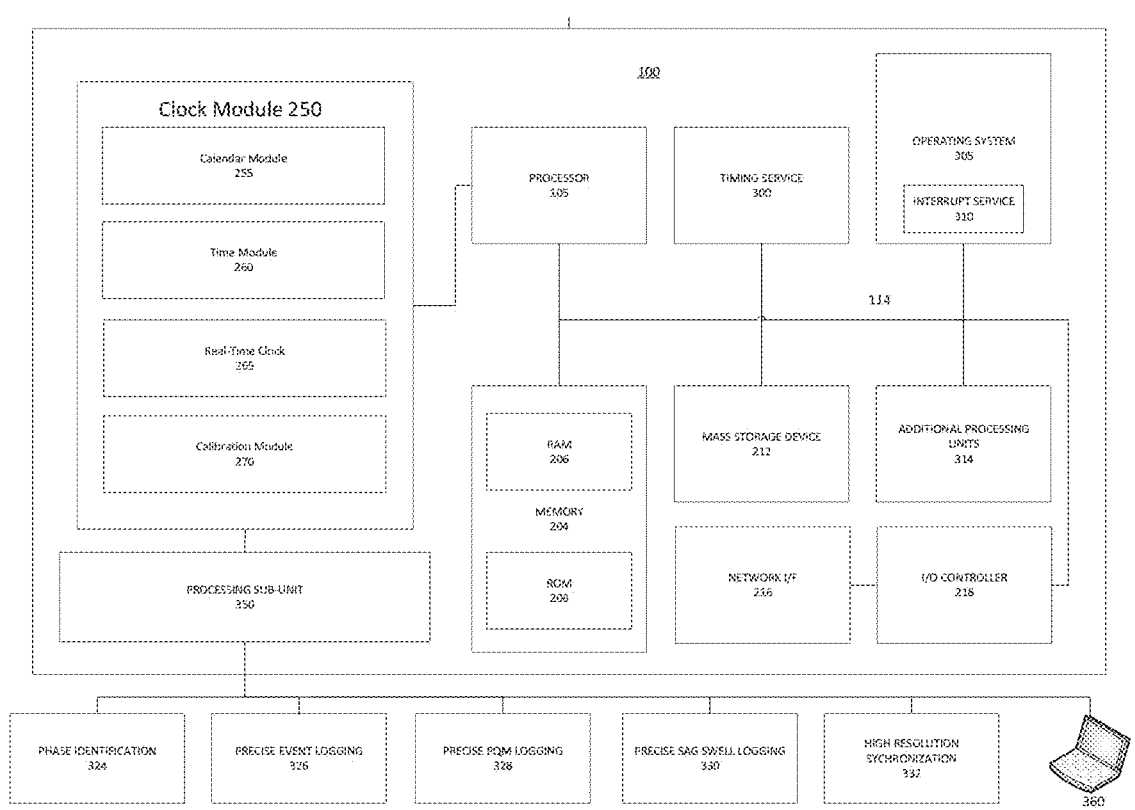
FIG. 3 shows an illustrative architecture for a computing device for enhancing time resolution for the real-time clock.

FIG. 3 shows an illustrative architecture for a computing device for the present use of enhancing time resolution for a real-time clock. In one example, the architecture can be for an electronic device 100, such as an electronic power meter and the like. The device 100 illustrated in FIG. 3 includes one or more processors 105, a system memory 204, including RAM (random access memory) 206 and ROM (read only memory) 208, and a system bus 114 that operatively and functionally couples the components in the device 100. The device 100 further includes a mass storage device 212 for storing software code or other computer-executed code that is utilized to implement applications, the file system, and the operating system. The mass storage device 212 is connected to the processor 105 through a mass storage controller (not shown) connected to the bus 114. The mass storage device 212 and its associated computer-readable storage media provide non-volatile storage for the device 100.

According to various implementations, the device 100 may operate in a networked environment using logical connections to remote computers through a network. The device 100 may connect to the network through a network interface unit 216 connected to the bus 114. It may be appreciated that the network interface unit 216 also may be utilized to connect to other types of networks and remote computer systems. The device 100 also may include an input/output controller 218 for receiving and processing input from a number of other devices, including a keyboard, mouse, touchpad, touchscreen, control devices such as buttons, and switches or electronic stylus (not shown in FIG. 3). Similarly, the input/output controller 218 may provide output to a display screen, user interface, a printer, or other type of output device (also not shown in FIG. 3).

FIG. 3 further includes a processor 105, which is coupled to a clock module 250. The clock module 250. The clock module 250 keeps and maintains time at a required level of precision using a real-time clock 265. This includes utilizing a time module 260 and a calendar module 255. In one implementation, the real-time clock 265 keeps time at a one second resolution. Corresponding additional processing units 314, such as a hardware timer, keeps a higher time resolution time than one second. In one example a hardware timer in the additional processing units 314 keeps millisecond time.

In one implementation, an operating system (OS) 305 controls the electronic device 100. The OS 305 utilizes an interrupt service 310. The interrupt service, in one example, is coupled to the real-time clock 265 such that the interrupt service 310 can provide a one second interrupt to the OS 305 whenever the real-time clock indicates a second of time has elapsed. Furthermore, the interrupt service can be coupled to the additional processing units 314 such that it can provide a sub-second constant that can be loaded into the system memory 204. The sub-second constant can be a timing associated with the clock frequency of the additional processing units 314. In one implementation, the sub-second constant is one millisecond.

In other implementations, the relationship between the real-time clock and the processing unit can be different, so long as the frequencies of the two clocks differ and can be calibrated. Time is typically denoted in fractions of seconds and in amounts greater than a second. Tables 1 and 2 show the common ways time is denoted using this scheme. Table 1 shows time increments that are less than a second. Table 2 shows time increments that are greater than one second. In practice the real-time clock and the processing unit could correspond to any of the fractions of time in Tables 1 and 2, so long as the processing unit is of a higher frequency than the real-time clock.

TABLE 1

| Unit | Symbol | Description |
|---|---|---|
| nanoseconds | ns | 1 second = 1,000,000,000 nanoseconds |
| microseconds | μs | 1 second = 1,000,000 microseconds |
| milliseconds | ms | 1 second = 1,000 milliseconds |

TABLE 2

| Unit | Symbol | Description |
|---|---|---|
| seconds | s or sec | base unit of Time |
| kiloseconds | ks | 1,000 seconds = 1 kiloseconds |
| minutes | min | 1 minute = 60 seconds |
| hours | hr | 1 hours = 60 minutes |
| days | d | 1 day = 24 hours |
| weeks | wk | 1 week = 7 days |

A timing service 300 has access to system memory 204 and can receive both the one second interrupt from the interrupt service 310 and the sub-second constant from the system memory 204. By way of example, assume that the input clock frequency for the additional processing units 314 is 100 MHz. If a timer is set to have this source, then this timer will tick every 1/(100*1000000) seconds. So, the value 100000 could be loaded into the system memory 204, and the interrupt service 310 can be programed to perform an interrupt when the count reaches zero. In this example, the timer will give interrupts every 1/1000 seconds (1 millisecond). In other examples, the timer can give interrupts at any fraction of a second that is feasible. See, Tables 1 and 2, for example. Using the interrupts, the timing service 300 can combine the time from the real-time clock 265 for each second with the countdown of the timer for each millisecond.

Calibration

In addition to enhancing the resolution of real-time clock 265, one implementation uses calibration module 270. The calibration module 270 ensures that real-time clock 265 and any higher resolution signals from additional processing units 314 remain coordinated. To that end, calibration module 270 can reset a higher resolution timer in the additional processing units 314 in a manner that is coordinated with the lower resolution signal. For example, the calibration module 270 might reset a millisecond timer every second. For instance, if the first and second resolution signals experience any drift over time, for example if the real-time clock 265 or additional processing units 314 are slow, and if the real-time clock 265 sends a subsequent interrupt, it might arrive when the countdown of the timer is 10, not zero as it should be, then the 1-second interrupt is reloaded by the timer of the interrupt service 310 with 1000 to start the next millisecond counter. By doing this the device 100 can achieve millisecond or better time resolution. It should be noted that an even higher time resolution is possible depending on the capabilities and needs of the system. Tables 1 and 2 show other fractions of time that can be used in other examples.

Device further includes a processing sub-unit 350. Processing sub-unit is configured to receive input from a number of devices, systems, or operators. In one example, a second device 360 is used to provide input to the processing sub-unit 350, wherein the input requires a resolution that exceeds the real-time clock 265. This could include, for example, a phase identification command 324, a precise event logging command 326, a precise PQM (power quality monitor) logging command 328, a precise sag and swell logging command 330, or a high resolution synchronization command 332. High resolution synchronization command 332 could include, for example, a demand for sub-second timing for synchronizing events between meters on the same feeder line.

Figure 4:
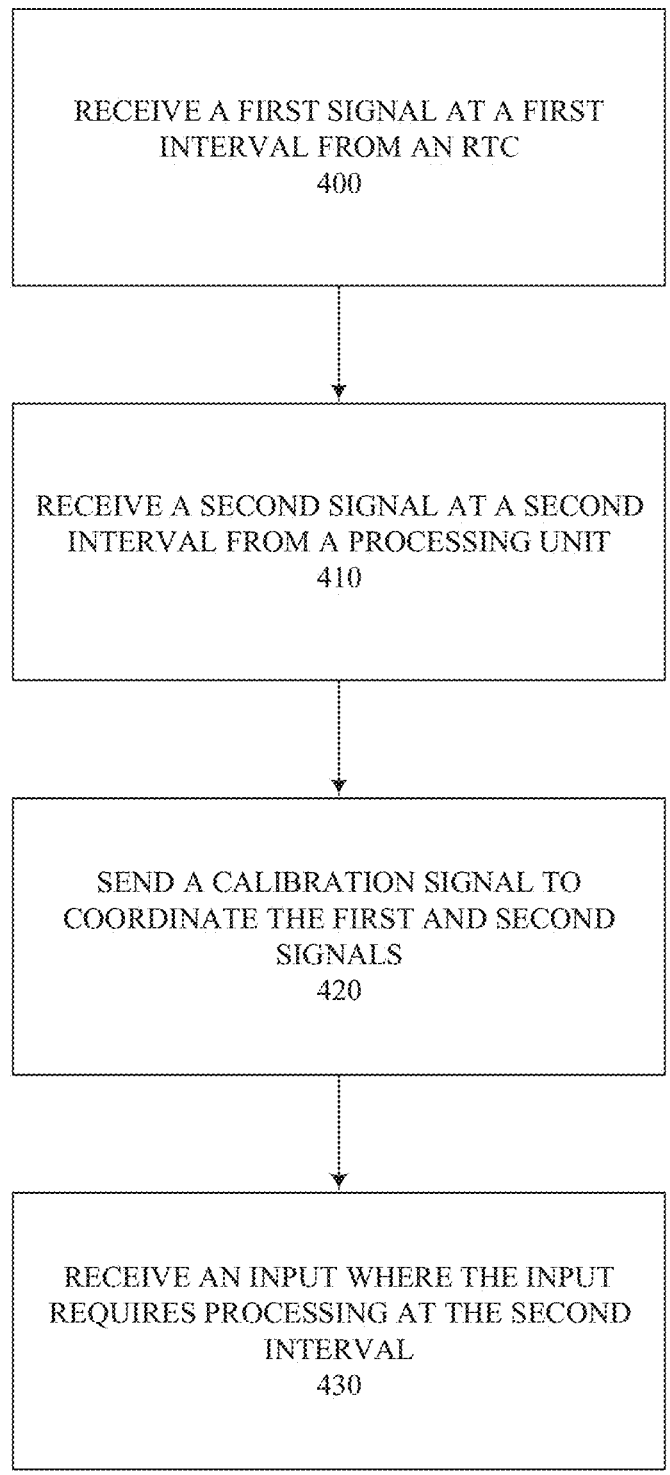
FIG. 4 is a flowchart that illustrates the present use of enhancing time resolution for the real-time clock.

FIG. 4 is a flowchart that illustrates the present use of enhancing time resolution for a real-time clock. At step 400, a first signal is received at a first interval from the real-time clock of the electronic device. In one example, this signal is at a one second resolution. This can be useful, for example, to correspond to a typical calendar and clock that can be used for timing in an electronic power meter. At step 410, a second signal is received at a second interval from a processing unit of the electronic device. In one implementation, the second interval has a shorter time resolution (e.g., a higher frequency) than the first interval (sub-second or millisecond, for example). In such a scenario, the real-time clock has a lower frequency than the processing unit because its clock advances and allows instructions on clock cycles that are longer in time than the processing unit.

At step 420, a calibration signal is sent periodically at a rate that corresponds to the second interval. The calibration signal is configured to coordinate the first and second intervals. The calibration signal can be used, for example, by a higher-level timing service in an electronic power meter. Each time the first interval passes, the second interval is used as a constant offset to the first interval in order to implement a timing that has a higher frequency the real-time clock. Each time the first interval passes, the calibration signal is used by one implementation to reset a timer that runs at the second resolution in order to minimize drift between the first and second intervals over time. Finally, at step 430, an input is received at the electronic device, wherein the input requires a higher frequency than the frequency of the real-time clock. This can be for example, a second device connected to the electronic power meter. The second device could be requesting, for example, phase identification, precise event logging, precise PQM (power quality monitor) logging, or precise sag and swell logging. The second device may also be requesting a synchronizing event between multiple devices on the same feeder line, the synchronizing event being at a higher time resolution than the native real-time clock.

Figure 5:
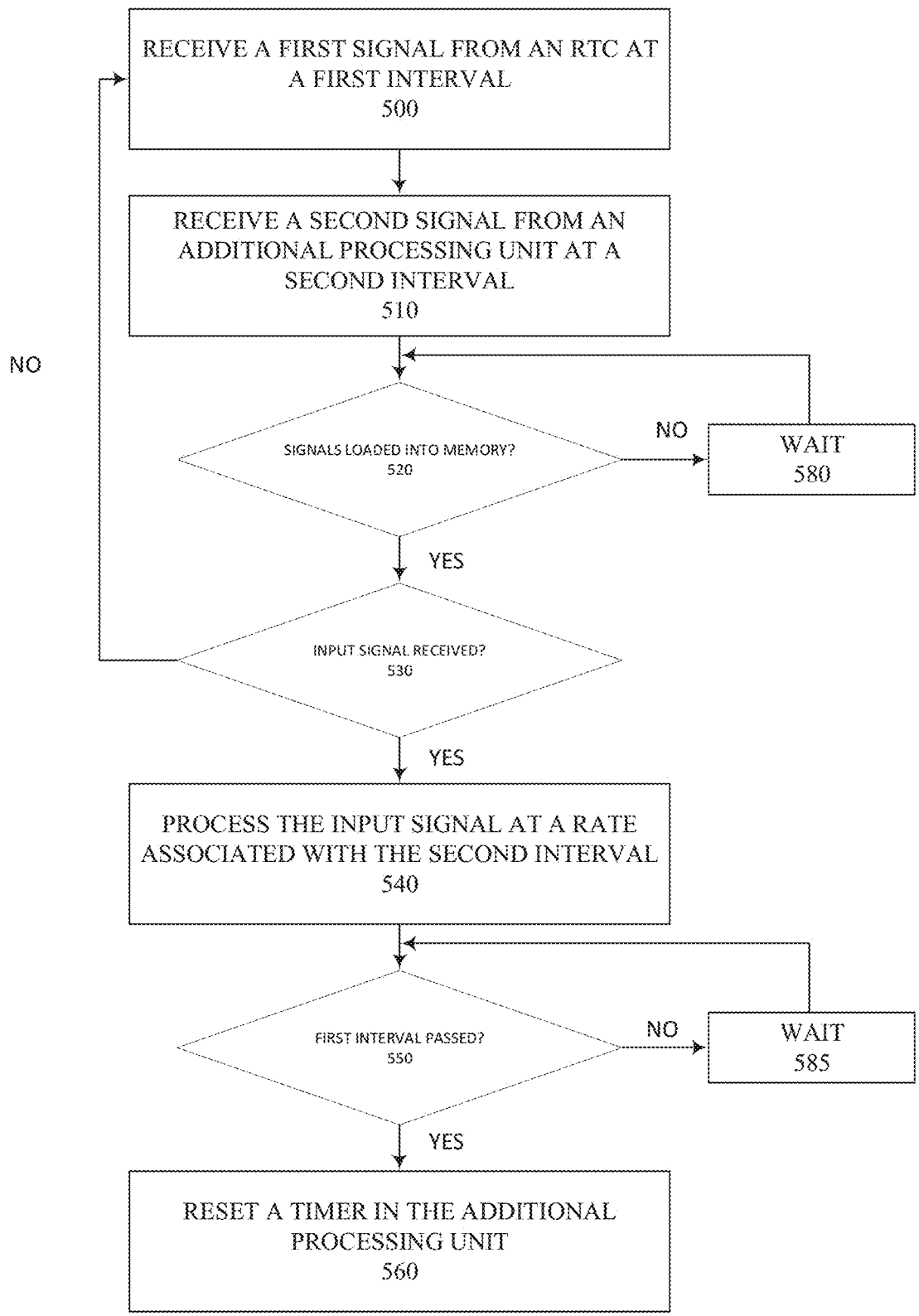
FIG. 5 is a flowchart that illustrates the present use of enhancing time resolution for the real-time clock.

FIG. 5 is a flowchart that illustrates the present use of enhancing time resolution for a real-time clock. At step 500, a first signal is received at a first interval from the real-time clock of the electronic device. In one example, this signal is at a one second resolution. This can be useful, for example, to correspond to typical calendar and clock that can be used for timing in an electronic power meter. At step 510, a second signal is received at a second interval from a processing unit of the electronic device. In one implementation, the second interval has a smaller resolution than the first interval (sub-second or millisecond, for example). In such a scenario, the real-time clock has a clock with a lower frequency than the frequency that the processing unit can process data.

At step 520, the system determines if the signals are loaded into memory. If not, the system waits at step 580. When the values are loaded into memory, the system determines at step 530 if an input signal is received. If there is not an input signal the process repeats at step 500 with a frequency associated with the first interval (one second, for example, in a typical that implements clock and calendar time). When an input signal is received, flow proceeds to step 530, where the input signal is processed at a rate that corresponds to the second interval. Thereafter, at step 540, the system determines if the first interval is passed. If not, the system waits at step 585. After the first interval, a timer in the additional processing unit is reset at step 560.

Figure 6:
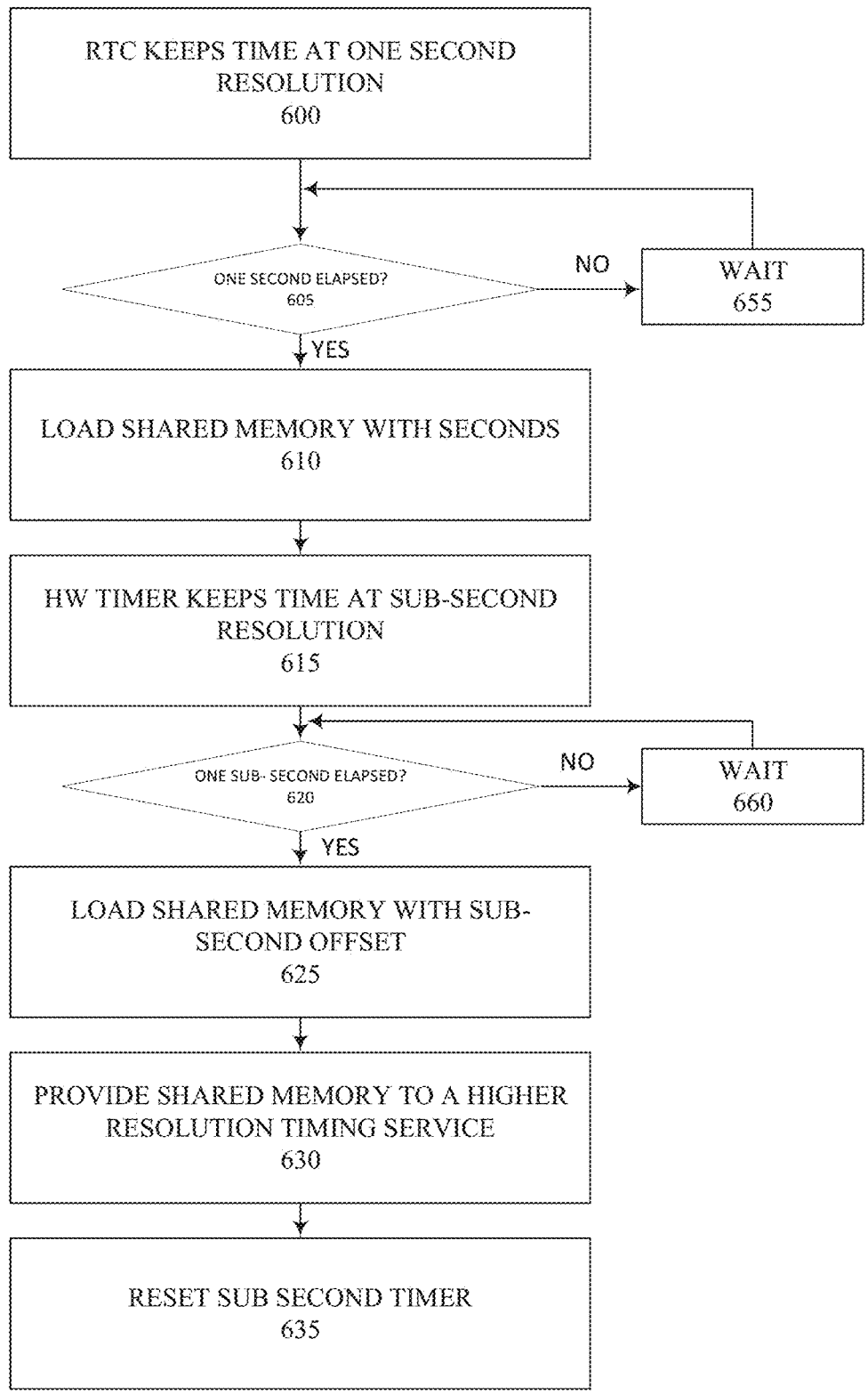
FIG. 6 is a flowchart that illustrates the present use of enhancing time resolution for the real-time clock.

FIG. 6 is a flowchart that illustrates the present use of enhancing time resolution for a real-time clock. At step 600, a real-time clock keeps time at a one second resolution. At step 605, the system determines whether one second has elapsed. In the present example, one second is used although it is possible to use other timing resolutions as well. In this example, the real-time clock corresponds to typical calendar and date time of a standard clock. The system waits at step 655 until one second elapses. Thereafter, a shared memory is loaded with the current second at step 610.

At step 615, a hardware timer keeps time at a sub-second time resolution. In one example, this sub-second time resolution may be milliseconds and the hardware timer could be associated with additional processing units as shown in FIGS. 2 and 3, although other resolutions are suitable as well. In general, any scheme can be used where the hardware timers can be synchronized and calibrated. Some examples of timing resolutions that can be implemented are designated in fractions of a second as shown in Tables 1 and 2. It is conceivable that any pair of fractions of a second could be utilized or in amounts that are greater than a second. At step 620, the system determines if one sub-second has elapsed. The system waits at step 660 until one sub-second elapses. Thereafter, a shared memory is loaded with the current sub-second offset at step 625. At step 630, the shared memory is provided to a higher time resolution timing service. At step 635, the sub-second timer is reset. Thereafter, the process repeats at step 605 (each second) although other increments of time are equally suitable in different implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A device comprising:
   a real-time clock configured to operate at a first time resolution;
   at least one processing unit configured to operate at a second time resolution, wherein the second time resolution has a higher frequency than the first time resolution;
   a memory for storing data at a location including data from the real-time clock and the at least one processing unit;
   an interrupt configured to load information into the memory at the location using the at least one processing unit, the interrupt further configured to operate at a frequency associated with the second time resolution;
   a timing service configured to read information from the memory at the location, the timing service configured to operate at the second time resolution; and
   a calibration module configured to re-calibrate the real-time clock at an interval associated with the first time resolution using an offset associated with the second time resolution; and
   a processing sub-unit wherein the processing sub-unit is configured to receive an input signal requiring a frequency that is higher than the frequency of the real-time clock.

2. The device of claim 1, wherein the processing sub-unit processes the input signal using a first signal at the first time resolution, a second signal at the second time resolution, and a calibration signal having a time resolution that is greater than the first time resolution.

3. The device of claim 2, wherein the processing sub-unit provides an output from the device to a second device.

4. The device of claim 1, wherein the interrupt is associated with an operating system of the device.

5. The device of claim 1, wherein the device is an electronic power meter.

6. The device of claim 1, wherein the first time resolution is one second.

7. The device of claim 1, wherein the second time resolution is one millisecond.

8. The device of claim 1, wherein the second device is selected from a group consisting of a remote computer, a server, a utility, or an external system connected via a network.

9. A system comprising:
   a clock system comprising a real-time clock that operates at a one second frequency;
   a processing system that operates at a one millisecond frequency;
   a memory system for storing data associated with the clock system and the processing system, the memory system operating at a frequency of at least one millisecond;
   an operating system for loading the data in the memory system at a frequency of at least one millisecond;
   a calibration system for coordinating the clock system and the processing system at a frequency of one second by applying a millisecond offset to the real-time clock every second;
   a control system for sending an input signal to the operating system, the input signal requiring a frequency of one millisecond; and
   a processing sub-system to receive the input signal and process the input signal at a rate associated with one millisecond.

10. The system of claim 9, wherein the input signal is a phase identification signal.

11. The system of claim 9, wherein the input signal is a precise event logging signal.

12. The system of claim 9, wherein the input signal is from a group consisting of a PQM logging signal and a precise sag and swell logging signal.

13. The system of claim 9, wherein the input signal is a synchronizing signal for an event between a first and a second meter on a feeder line.

14. A method to enhance a time resolution of a real-time clock in an electronic device, comprising:
    receiving a first signal at a first interval from the real-time clock of the electronic device;
    receiving a second signal at a second interval from a processing unit, of the electronic device, wherein the second interval of the second signal has a higher frequency resolution than the first interval of the first signal and wherein the real-time clock has a lower frequency than the processing unit;
    sending a calibration signal periodically at a rate that corresponds to the second interval, wherein the calibration signal is used to coordinate the first and second intervals; and
    receiving an input at the electronic device, wherein the input requires a higher frequency than the frequency of the real-time clock.

15. The method of claim 14, further comprising:
    processing the input in the electronic device using the first signal, the second signal, and the calibration signal; and
    providing an output from the electronic device to a second device.

16. The method of claim 14, wherein the processing unit is an interrupt service associated with an operating system of the electronic device.

17. The method of claim 14, wherein the electronic device is an electronic power meter.

18. The method of claim 14, wherein the first interval is selected from a group consisting of a nanosecond, a microsecond, a millisecond, a second, a kilosecond, and a minute.

19. The method of claim 14, wherein the second interval is selected from a group consisting of a nanosecond, a microsecond, a millisecond, a second, a kilosecond, and a minute.

20. The method of claim 15, wherein the second device is from a group consisting of a remote computer, a server, a utility, or an external system connected via a network.

* * * * *